(12) United States Patent
Lee et al.

(10) Patent No.: US 9,153,944 B2
(45) Date of Patent: Oct. 6, 2015

(54) LIGHT-EMITTING ARRAY

(71) Applicant: Epistar Corporation, Hsinchu (TW)

(72) Inventors: Shih-Chang Lee, Hsinchu (TW);
Chih-Chiang Lu, Hsinchu (TW);
Yi-Hung Lin, Hsinchu (TW);
Wu-Tsung Lo, Hsinchu (TW);
Ta-Chuan Kuo, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/173,650

(22) Filed: Feb. 5, 2014

(65) Prior Publication Data
US 2015/0222094 A1    Aug. 6, 2015

(51) Int. Cl.
| | |
|---|---|
| *H01S 5/00* | (2006.01) |
| *H01S 5/42* | (2006.01) |
| *H01S 5/042* | (2006.01) |
| *H01S 5/343* | (2006.01) |
| *H01S 5/183* | (2006.01) |

(52) U.S. Cl.
CPC .............. *H01S 5/423* (2013.01); *H01S 5/0425* (2013.01); *H01S 5/18361* (2013.01); *H01S 5/34313* (2013.01)

(58) Field of Classification Search
CPC .............. H01S 5/0425; H01S 5/18361; H01S 5/34313; H01S 5/423
USPC ........................................ 372/50.12, 50.124
See application file for complete search history.

(56) References Cited

U.S. PATENT DOCUMENTS

2009/0129419 A1*  5/2009  Matsushita et al. ......... 372/45.01
2011/0274131 A1* 11/2011  Takaki et al. ............ 372/50.124

* cited by examiner

*Primary Examiner* — Yuanda Zhang
(74) *Attorney, Agent, or Firm* — Ditthavong & Steiner, P.C.

(57) ABSTRACT

A light-emitting array comprises a plurality of light-emitting elements, wherein each of the plurality of light-emitting elements comprises a first semiconductor stack; and a plurality of bridge structures connected to the plurality of light-emitting elements, wherein the plurality of light-emitting elements are spaced apart by the plurality of bridge structures, wherein each of the plurality of bridge structures comprise a second semiconductor stack which has the same epitaxial stack as the first semiconductor stack.

20 Claims, 17 Drawing Sheets

LIGHT-EMITTING ARRAY

TECHNICAL FIELD

The application relates to a light-emitting array, and more particularly, to a light-emitting array having a plurality of light-emitting elements and a plurality of bridge structures connected to the plurality of light-emitting elements.

DESCRIPTION OF BACKGROUND ART

A vertical cavity surface emitting laser (VCSEL) is a laser capable of emitting a light in a direction perpendicular to an active region. The VCSEL comprises a structure having a pair of mirror stacks, and an active region formed between the pair of mirror stacks. A first electrode and a second electrode are respectively formed above and below the pair of mirror stacks. An electrical current is injected into the active region through the first electrode and the second electrode to generate the light in the active region, and the light is emitted from an opening which is formed on an upper surface of the VCSEL structure.

SUMMARY OF THE APPLICATION

A light-emitting array comprises a plurality of light-emitting elements, wherein each of the plurality of light-emitting elements comprises a first semiconductor stack; and a plurality of bridge structures connected to the plurality of light-emitting elements, wherein the plurality of light-emitting elements is spaced apart by the plurality of bridge structures, wherein each of the plurality of bridge structures comprises a second semiconductor stack which has the same epitaxial stack as the first semiconductor stack.

DETAILED DESCRIPTION OF PREFERRED EMBODIMENTS

Figure 1:
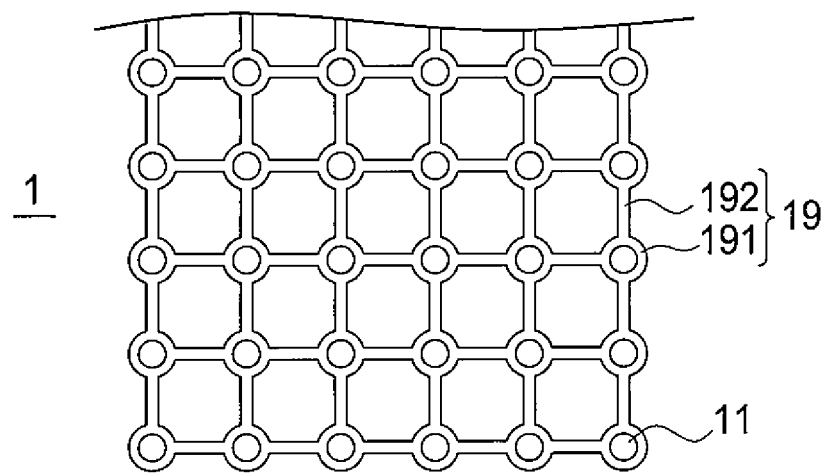
FIG. 1 illustrates a top view of a light-emitting array in accordance with first embodiment of the present application.

The embodiment of the application is illustrated in detail, and is plotted in the drawings. The same or the similar part is illustrated in the drawings and the specification with the same number.

FIG. 1 illustrates a top view of a light-emitting array 1 in accordance with first embodiment of the present application. The light-emitting array 1, such as a vertical cavity surface emitting laser (VCSEL), comprises a plurality of light-emitting elements 11 and a first electrode 19 provided in a contiguous layer and connected to the plurality of light-emitting elements 11, wherein the first electrode 19 comprises a plurality of contact portions 191 respectively formed on each of the plurality of light-emitting elements 11 and a plurality of connecting portions 192 respectively formed between adjacent two contact portions 191. Each of the plurality of light-emitting elements 11 comprises a circular shape of top view as shown in FIG. 1, a polygonal shape, or a radially shape of top view (not shown). Each contact portion 191 surrounds a sidewall of each light-emitting element 11 and covers part of a top surface of each light-emitting element 11, such that the contact portions 191 has a ring-like shape of top view as shown in FIG. 1 and each connecting portion 192 can be provided in a line form. The first electrode 19 further comprises a pad portion (not shown), and the plurality of connecting portions 192 is jointly connected to the pad portion (not shown).

Figure 2:
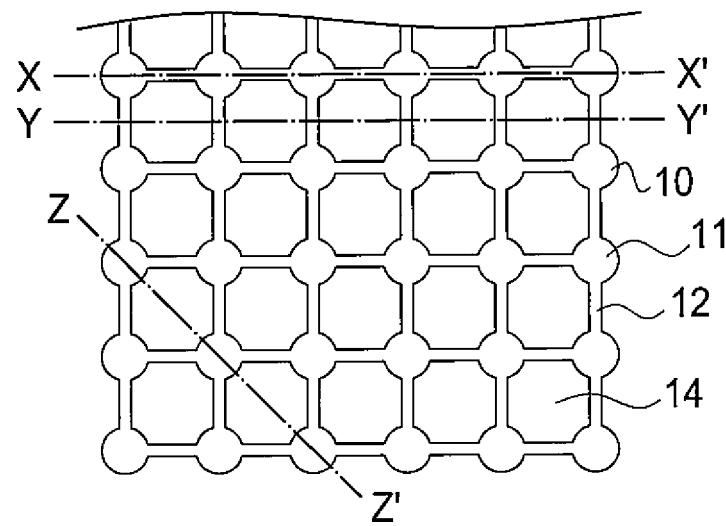
FIG. 2 illustrates a top view of an epitaxial stack of the light-emitting array being etched in accordance with first embodiment of the present application.
Figure 2A:
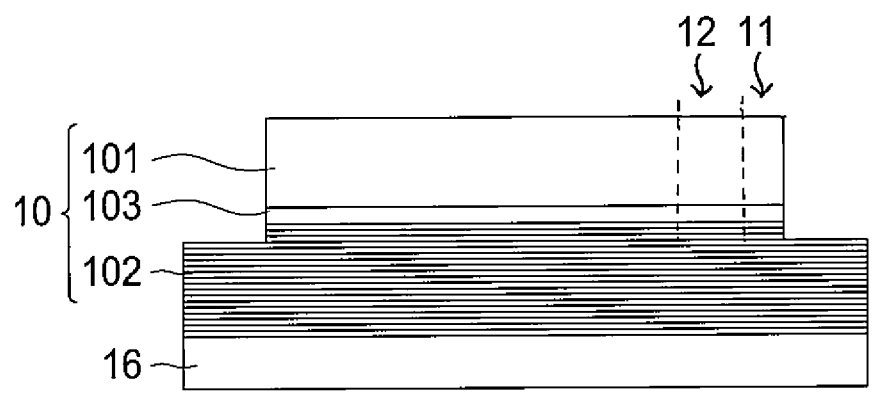
FIG. 2A illustrates a cross-sectional view taken along line X-X' of FIG. 2.

FIG. 2 to FIG. 4C illustrate a manufacturing method of the light-emitting array 1 of FIG. 1. FIG. 2 illustrates a top view of an epitaxial stack 10 being etched in accordance with first embodiment of the present application. FIG. 2A illustrates a cross-sectional view taken along line X-X' of FIG. 2. The epitaxial stack 10 is formed on a conductive substrate 16, such as GaAs substrate. Then, the epitaxial stack 10 is divided into a plurality of light-emitting elements 11, a plurality of bridge structures 12 and a plurality of trenches 14 by lithography and etching. In the embodiment, the plurality of trenches 14 is arranged in columns and rows, and each trench 14 comprises a polygonal shape, such as rectangular shape shown in FIG. 2, a radially shape, or a circular shape (not shown). The plurality of light-emitting elements 11 and the plurality of bridge structures 12 are arranged in a grid like pattern. The plurality of light-emitting elements 11 is spaced apart by the plurality of bridge structures 12. Each of the plurality of light-emitting elements 11 comprises a first semiconductor stack, and each of the plurality of bridge structures 12 comprises a second semiconductor stack which has the same epitaxial stack as the first semiconductor stack. The material of the epitaxial stack 10 comprises group III-V semiconductor material doped with p-type impurity and/or n-type impurity. The epitaxial stack 10 comprises a top mirror stack 101 having a first conductivity type, such as p-type, a bottom mirror stack 102 having a second conductivity type different from the first conductivity type, such as n-type, and an active layer 103 formed between the top mirror stack 101 and the bottom mirror stack 102. The epitaxial stack 10 may be formed on the substrate 16 by a known epitaxy method, such as metallic-organic chemical vapor deposition (MOCVD) method, a molecular beam epitaxy (MBE) method, or a hydride vapor phase epitaxy (HVPE) method. In an example of the embodiment, the top mirror stack 101 can be a p-type DBR mirror stack formed by alternately laminating a high refractive index layer and a low high refractive index layer, such as pairs of p-type $Al_{x1}Ga_{(1-x1)}As$ layer and p-type $Al_{x2}GaAs_{(1-x2)}$ layer, wherein $0<x1, x2<1$ and $x1<x2$. The aluminum content x1 or x2 of a layer in the top mirror stack 101 can be between 0.8 and 0.02, preferably between 0.9 and 0.12. The bottom mirror stack 102 can be a n-type DBR mirror stack formed by alternately laminating a high refractive index layer and a low high refractive index layer, such as pairs of n-type $Al_{x3}Ga_{(1-x3)}As$ layer and n-type $Al_{x4}GaAs_{(1-x4)}$ layer, wherein $0<x3, x4<1$ and $x3<x4$. The aluminum content x3 or x4 of a layer in the bottom mirror stack 102 can be between 0.8 and 0.02, preferably between 0.9 and 0.12. The active layer 103 comprises a single heterostructure (SH), a double heterostructure (DH), or a multi-quantum well (MQW) structure. The electrons provided from the n-type DBR mirror stack, such as the bottom mirror stack 102, and the holes provided from the p-type DBR mirror stack, such as the top mirror stack 101, combine in the active layer 103 to emit a light under an external electrical driving current.

As shown in FIG. 2A, the bridge structure 12 is connected to the light-emitting element 11. The plurality of light-emitting elements 11 comprises the same epitaxial stack as the plurality of bridge structures 12.

Figure 2B:
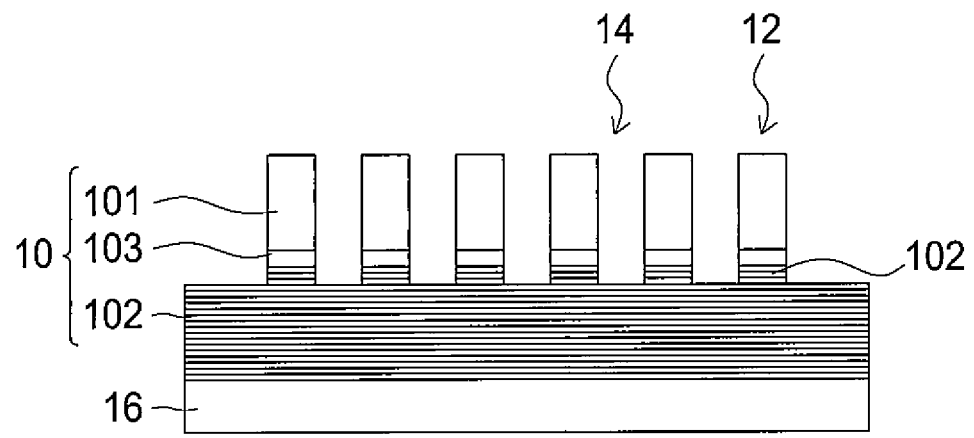
FIG. 2B illustrates a cross-sectional view taken along line Y-Y' of FIG. 2.

FIG. 2B illustrates a cross-sectional view taken along line Y-Y' of FIG. 2. The plurality of bridge structures 12 is separated from each other by a plurality of trenches 14. Trench 14 extends downward through the epitaxial stack 10 to part of the bottom mirror stack 102. Specifically, the bridge structures 12 and the trenches 14 are alternately arranged.

Figure 2C:
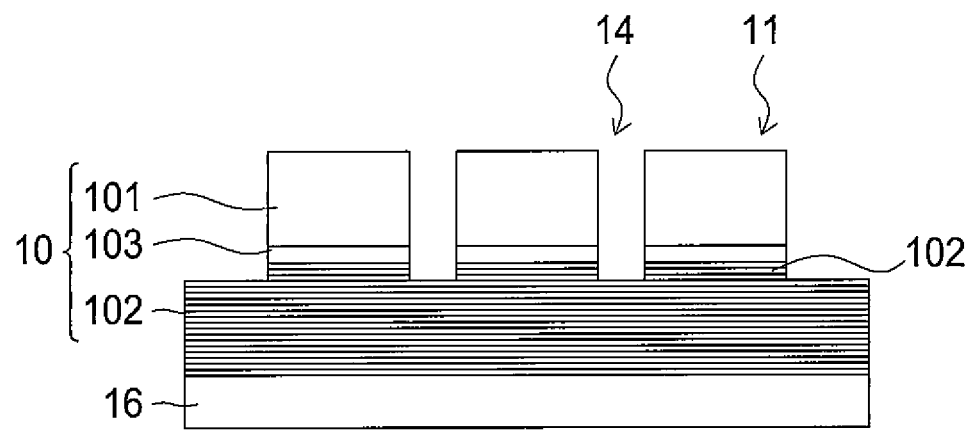
FIG. 2C illustrates a cross-sectional view taken along line Z-Z' of FIG. 2.

FIG. 2C illustrates a cross-sectional view taken along line Z-Z' of FIG. 2. The plurality of light-emitting elements 11 is separated from each other by the plurality of trenches 14. Specifically, the light-emitting elements 11 and the trenches 14 are alternately arranged.

Figure 3:
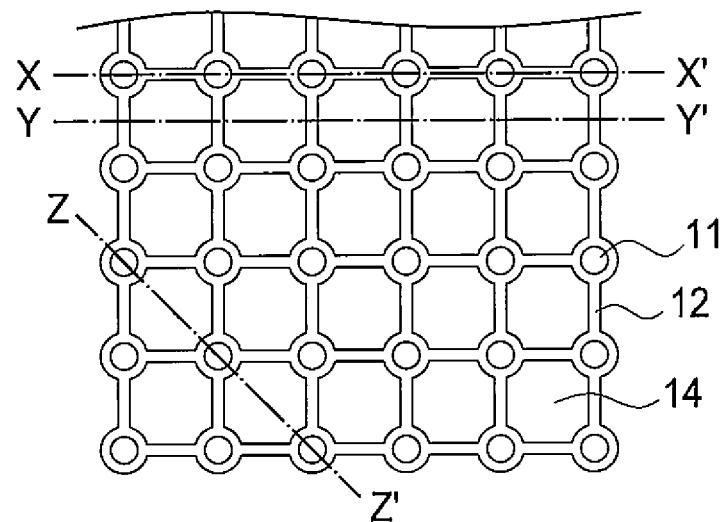
FIG. 3 illustrates a top view of the epitaxial stack of the light-emitting array being oxidized in accordance with first embodiment of the present application.
Figure 3A:
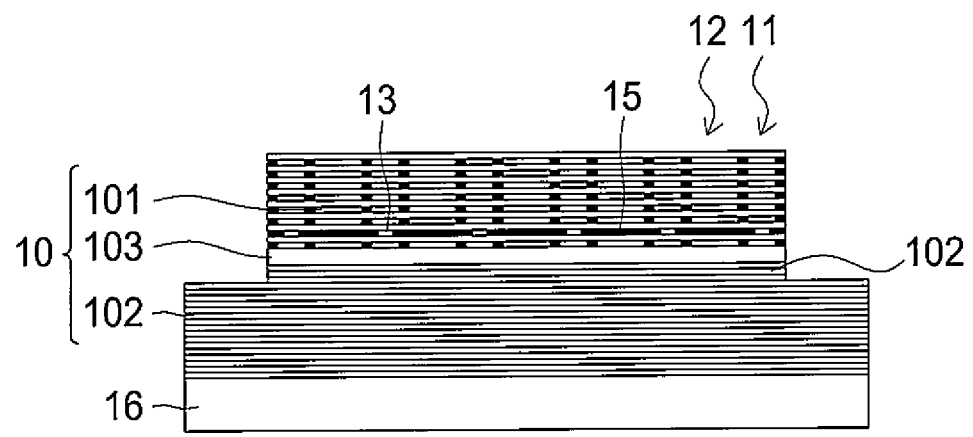
FIG. 3A illustrates a cross-sectional view taken along line X-X' of FIG. 3.

FIG. 3 illustrates a top view of the epitaxial stack 10 being oxidized in accordance with first embodiment of the present application. FIG. 3A illustrates a cross-sectional view taken along line X-X' of FIG. 3. The light-emitting element 11 and the bridge structure 12 are surrounded by the trenches 14. Layers of the top mirror stack 101 with higher aluminum content is oxidized more easily than the layers of the top mirror stack 101 with lower aluminum content. The top mirror stack 101 can be oxidized laterally via the trenches 14 and the external edges of the layers with higher aluminum content. The portions of the layers with higher aluminum content of the top mirror stack 101 being oxidized are electrically insulated. In an example of the embodiment, the top mirror stack 101 comprises a confinement layer 15 in a bottom portion of the top mirror stack 101 as shown in FIG. 3A. In another example of the embodiment, the confinement layer 15 can be formed between the top mirror stack 101 and the active layer 103. The confinement layer 15 comprises group III-V semiconductor materials comprising Al, such as $Al_{x5}Ga_{(1-x5)}As$, wherein $0.9 \leq x \leq 1.0$. The aluminum content x5 of the confinement layer 15 is higher than the aluminum content x1 or x2 of the layers in the top mirror stack 101 and/or the aluminum content x3 or x4 of the layers in the bottom mirror stack 102. For example, the confinement layer 15 can be $Al_{0.98}Ga_{0.02}As$. As shown in FIG. 3A, the confinement layer 15 in the plurality of bridge structures 12 is continuously connected to the confinement layer 15 in the plurality of light-emitting elements 11. The portions of the confinement layer 15 being oxidized are electrically insulated, and another portion of the confinement layer 15 not being oxidized forms a plurality of current confinement apertures 13. The confinement layer 15 in the plurality of bridge structures 12 is preferably oxidized, and the confinement layer 15 in the plurality of light-emitting elements 11 is partially oxidized. The current confinement aperture 13 is formed in the portion of the confinement layer 15 not being oxidized of the light-emitting element 11, and the current injected from the first electrode 19 of FIG. 1 is directed to pass through the current confinement aperture 13.

Figure 3B:
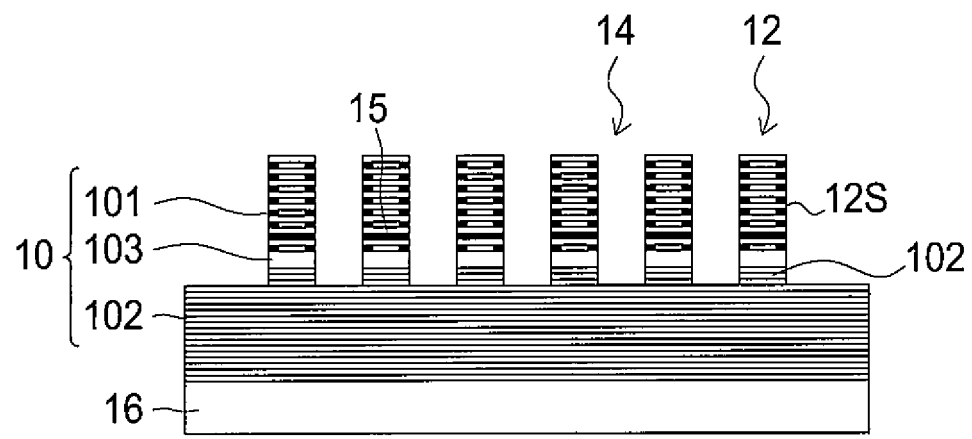
FIG. 3B illustrates a cross-sectional view taken along line Y-Y' of FIG. 3.

FIG. 3B illustrates a cross-sectional view taken along line Y-Y' of FIG. 3. The $Al_{x5}Ga_{(1-x5)}As$ based confinement layer 15 of the bridge structures 12 is oxidized, preferably totally oxidized, which provides isolation for the bridge structures 12. The plurality of bridge structures 12 is separated from each other by the plurality of trenches 14, and the oxidation is done by laterally oxidation from a lateral side 12S of the bridge structure 12 or via the trench 14. Specifically, a steam containing oxygen flows into the trench 14 and laterally oxidized the sides of layers with aluminum content higher than 0.8 in the bridge structure 12 from the lateral side 12S of the bridge structure 12. Portions of the confinement layer 15 being oxidized in the plurality of bridge structures 12 are electrically insulated.

Figure 3C:
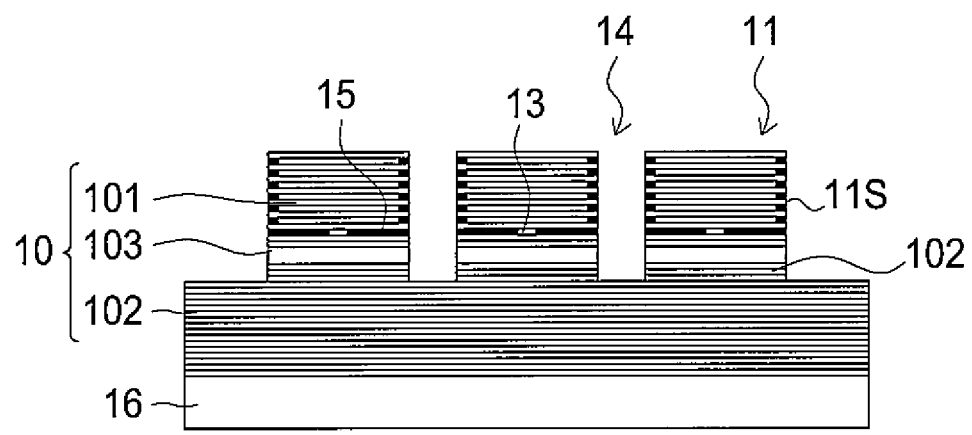
FIG. 3C illustrates a cross-sectional view taken along line Z-Z' of FIG. 3.

FIG. 3C illustrates a cross-sectional view taken along line Z-Z' of FIG. 3. The plurality of light-emitting elements 11 is separated from each other by the plurality of trenches 14. Part of the $Al_{x5}Ga_{(1-x5)}As$ based confinement layer 15 of the light-emitting element 11 is oxidized by laterally oxidation from a lateral side 11S of the light-emitting element 11. Specifically, a steam containing oxygen flows into the trench 14 from the lateral side 11S of the light-emitting element 11 and laterally oxidized the sidewall of the confinement layer 15 in the light-emitting element 11 and the sidewalls of layers with aluminum content higher than 0.8 in the light-emitting element 11. The oxidation rate can be controlled by the aluminum content, the amount of the steam, the steam temperature or the oxidation time. As shown in FIG. 3C, the current confinement aperture 13 is approximately formed in the center area of the confinement layer 15 in the light-emitting element 11.

Figure 4:
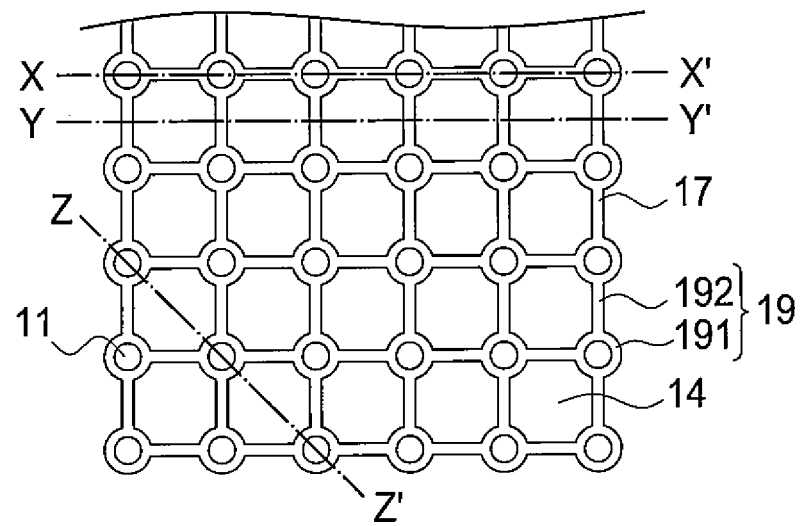
FIG. 4 illustrates a top view of the epitaxial stack of the light-emitting array having a first electrode formed thereon in accordance with first embodiment of the present application.
Figure 4A:
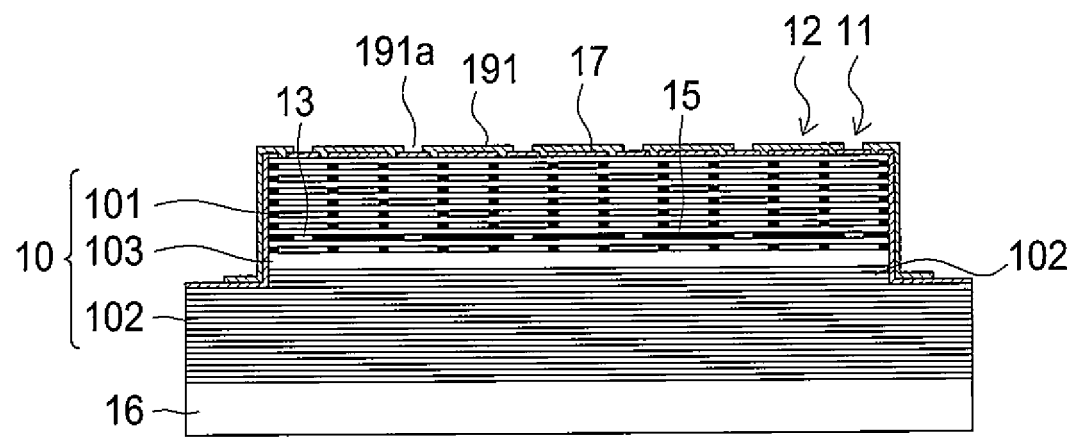
FIG. 4A illustrates a cross-sectional view taken along line X-X' of FIG. 4.

FIG. 4 illustrates a top view of the epitaxial stack 10 having a first electrode 19 formed thereon in accordance with first embodiment of the present application. FIG. 4A illustrates a cross-sectional view taken along line X-X' of FIG. 4. An insulated film can be conformably formed on the light-emitting element 11 and the bridge structure 12 by sputter or chemical vapor deposition (CVD). Following, the insulated film can be patterned by lithography, etching or lift-off to form one or more holes so an insulated layer 17 is formed. The material of the insulated layer 17 comprises inorganic material, such as silicon nitride or silicon oxide. Then, the first electrode 19 comprising metal or metal alloy is formed on the insulated layer 17 and in the holes. The first electrode 19 comprises a plurality of contact portions 191 respectively formed on a partial surface of the light-emitting elements 11, preferably formed on the periphery surface of the light-emitting element 11, and a plurality of connecting portions 192 formed on the whole surfaces of the bridge structures 12. The contact portion 191 has a ring-like shape of top view which forms an opening 191a on the light-emitting element 11, and the opening 191a is corresponding to the current confinement aperture 13. The opening 191a can be symmetrically formed on the top surface of the light-emitting element 11. The contact portion 191 and the connecting portion 192 form a contiguous layer.

Figure 4B:
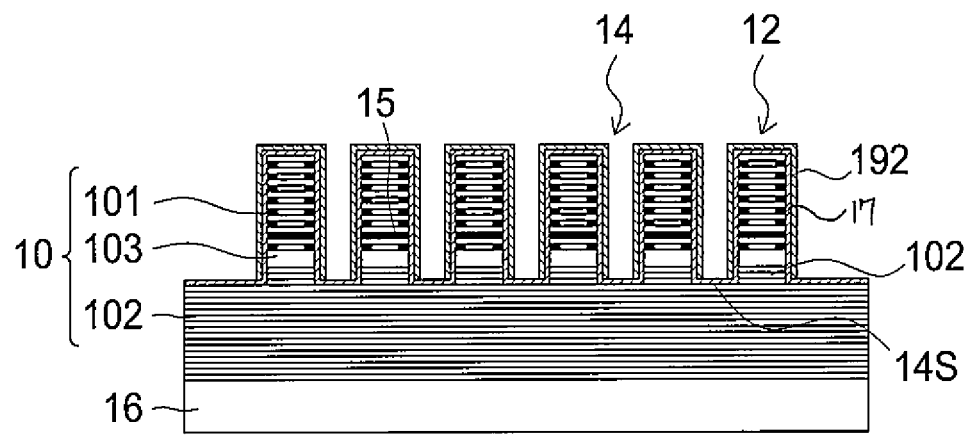
FIG. 4B illustrates a cross-sectional view taken along line Y-Y' of FIG. 4.

FIG. 4B illustrates a cross-sectional view taken along line Y-Y' of FIG. 4. The insulated layer 17 is conformably formed around the bridge structure 12 and on a surface 14S of trench 14 to electrically insulate the bridge structure 12 and the first electrode 19. Then, the connecting portion 192 is conformably formed on the insulated layer 17 to be a contiguous layer.

Figure 4C:
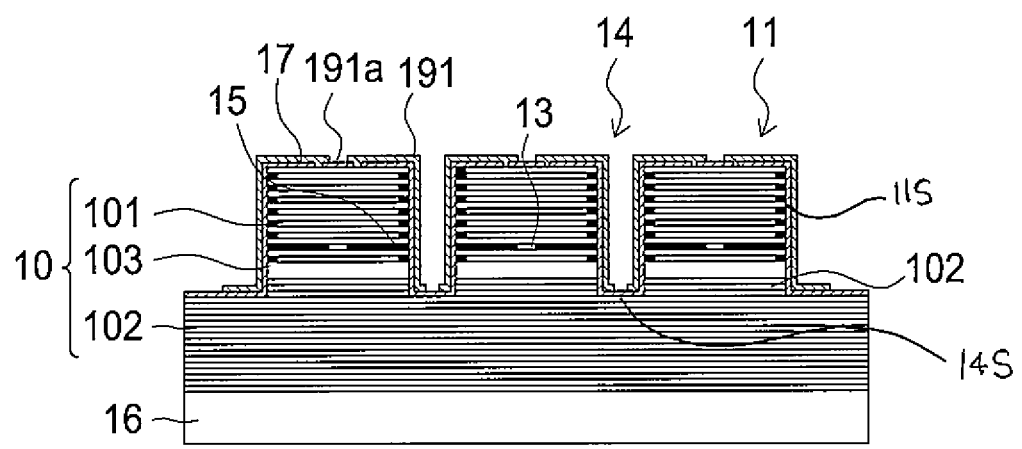
FIG. 4C illustrates a cross-sectional view taken along line Z-Z' of FIG. 4.

FIG. 4C illustrates a cross-sectional view taken along line Z-Z' of FIG. 4. The contact portions 191 forms a ring around each of the light-emitting elements 11, and the opening 191a is formed in the contact portions 191, preferably near a center area of the contact portion 191 and corresponding to the current confinement aperture 13. The contact portion 191 may extend along lateral side 11S of the light-emitting element 11 and contact partial surface 14S of the trench 14, but the contact portion 191 is formed discretely in the trench 14 between two adjacent light-emitting elements 11 as shown in FIG. 4C. In another example of the embodiment, the contact portions 191 may cover all bottom surfaces 14S of the trenches 14. The trench 14 provides isolation for the light-emitting array. Thus, the light of the light-emitting element 11 can be emitted out through the opening 191a.

Figure 5A:
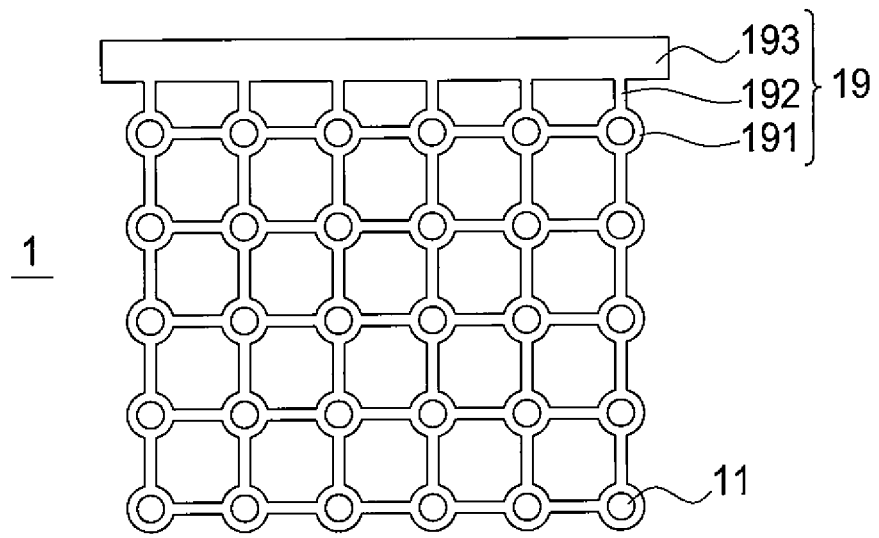
FIGS. 5A-5C illustrate top views of the light-emitting array having different shapes in accordance with first embodiment of the present application.
Figure 5B:
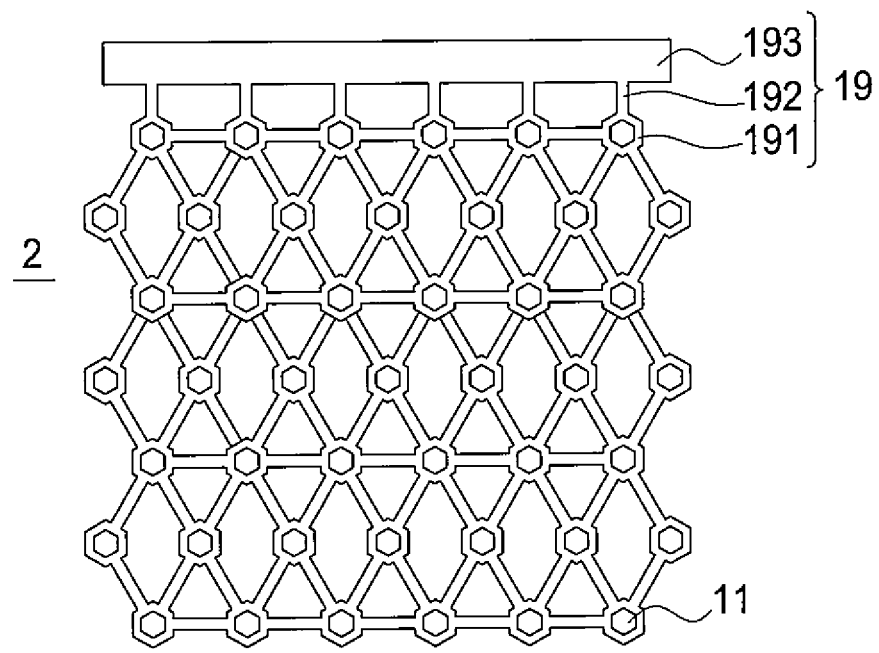
Figure 5C:
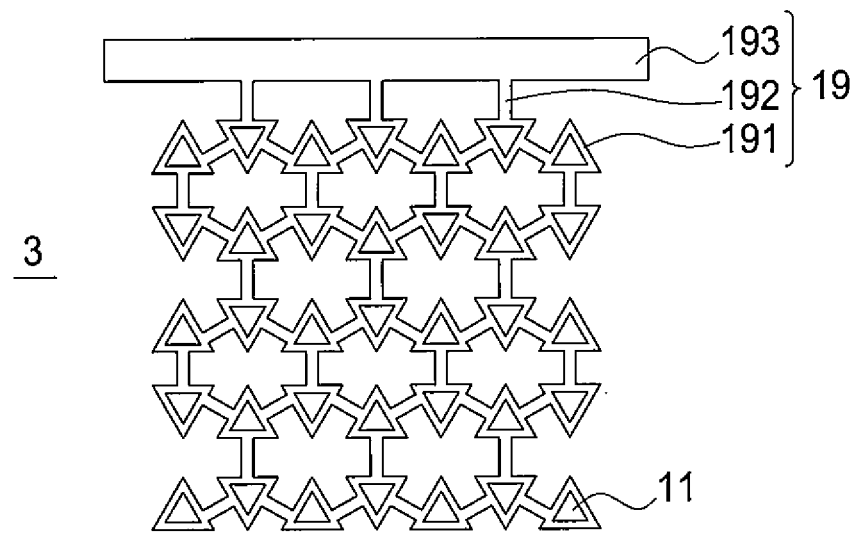

FIGS. 5A-5C illustrate top views of the light-emitting arrays 1, 2, and 3 having different top-viewed shapes in accordance with first embodiment of the present application. The plurality of light-emitting element 11 is arranged in columns and rows. The light-emitting element 11 comprises a circular shape or a polygonal shape. As shown in FIG. 5A, the light-emitting element 11 has a circular shape, the plurality of light-emitting elements 11 is arranged in a grid pattern. As shown in FIG. 5B, the light-emitting element 11 has a hexagonal shape, the plurality of light-emitting elements 11 is arranged in a honeycomb pattern. The amount and arrangement of the plurality of connecting portions 192 shown in FIG. 5B are for example, not intended to limit the application, specifically, the amount and arrangement of the plurality of connecting portions 192 can be adjusted in accordance with the amount of the light-emitting elements 11. As shown in FIG. 5C, the light-emitting element 11 has a triangular shape, the plurality of light-emitting elements 11 is arranged in a regular pattern so that vertexes of two adjacent triangles are towards reverse directions. The first electrode 19 further comprises a pad portion 193 which connected to the plurality of connecting portions 192. In an example of the embodiment, a second electrode (not shown) can be formed under the conductive substrate 16 of FIG. 4C. Current may be injected from the pad portion 193 and the second electrode (not shown). Following, the current spreads into each light-emitting element 11 through the connecting portion 192, and injects into each light-emitting element 11 through the contact portion 191. The current is restricted in an area of the top mirror stack 101 not oxidized and directed into the current confinement aperture 13 shown in FIG. 4C. Then, the current may pass through the active layer 103 and the bottom mirror stack 102 of each light-emitting element 11. A light is generated within a cavity constituted between the top mirror stack 101 and the bottom mirror stack 102. Finally, the light may be emitted to the outside through the opening 191a of the contact portion 191 on the light-emitting element 11 shown in FIG. 4C. A surface area of the pad portion is larger than an area of one of the plurality of light-emitting elements.

Figure 6:
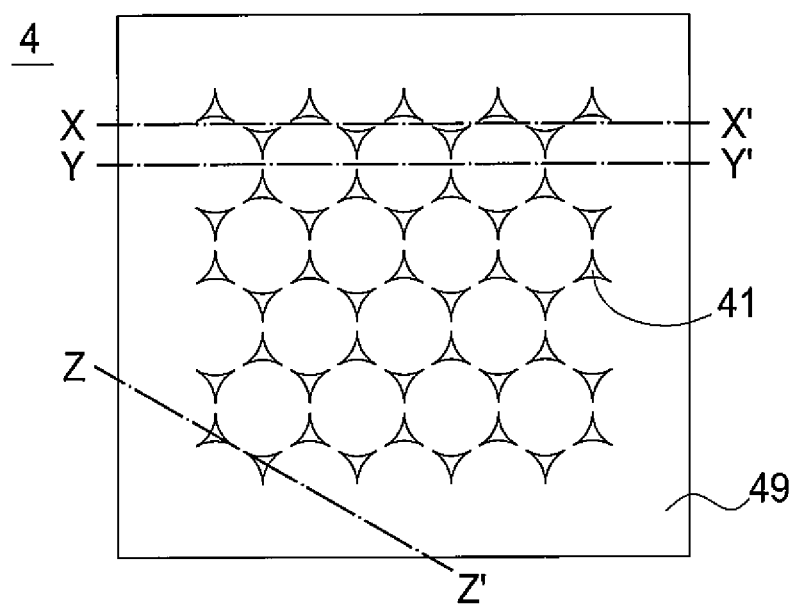
FIG. 6 illustrates a top view of a light-emitting array in accordance with second embodiment of the present application.

FIG. 6 illustrates a top view of a light-emitting array 4 in accordance with second embodiment of the present application. The light-emitting array 4, such as a vertical cavity surface emitting laser (VCSEL), comprises a plurality of light-emitting elements 41, and a first electrode 49 provided in a contiguous layer and connected to the plurality of light-emitting elements 41, wherein the first electrode 49 approximately covers the whole surface of the light-emitting array 4 other than partial areas of the light-emitting elements 41. Preferably, only the center areas of the plurality of light-emitting elements 41 are not covered by the first electrode 49 and are exposed. The first electrode 49 further comprises a pad portion (not shown). Each of the plurality of light-emitting elements 41 comprises a polygonal shape of top view, such as triangular shape as shown in FIG. 6, a radially shape, or a circular shape of top view (not shown).

Figure 7:
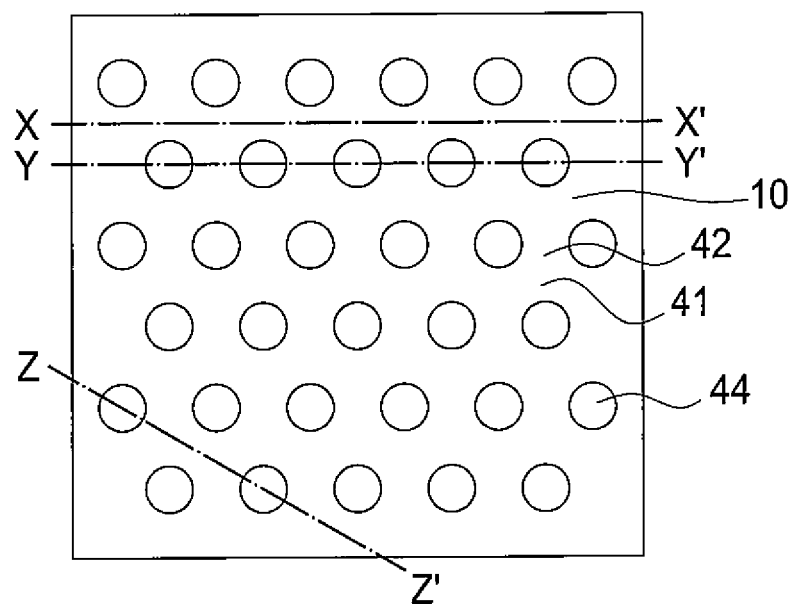
FIG. 7 illustrates a top view of an epitaxial stack of the light-emitting array being etched in accordance with second embodiment of the present application.
Figure 7A:
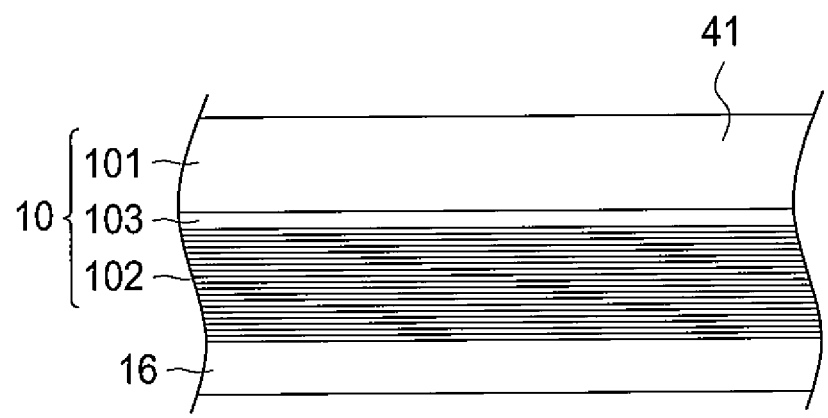
FIG. 7A illustrates a cross-sectional view taken along line X-X' of FIG. 7.
Figure 7B:
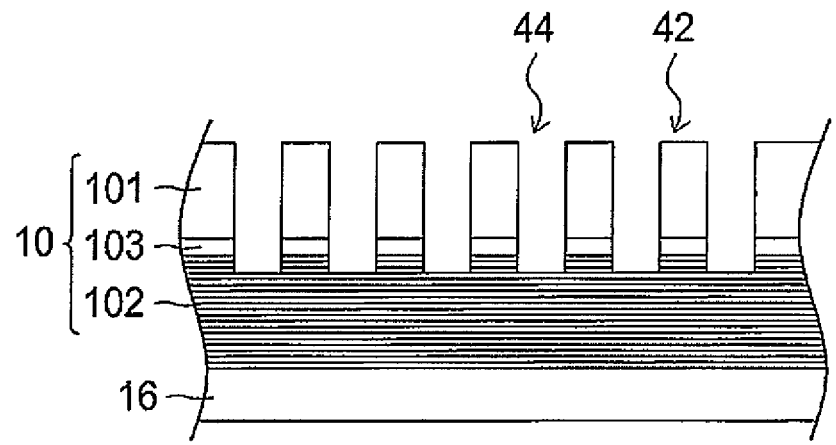
FIG. 7B illustrates a cross-sectional view taken along line Y-Y' of FIG. 7.
Figure 7C:
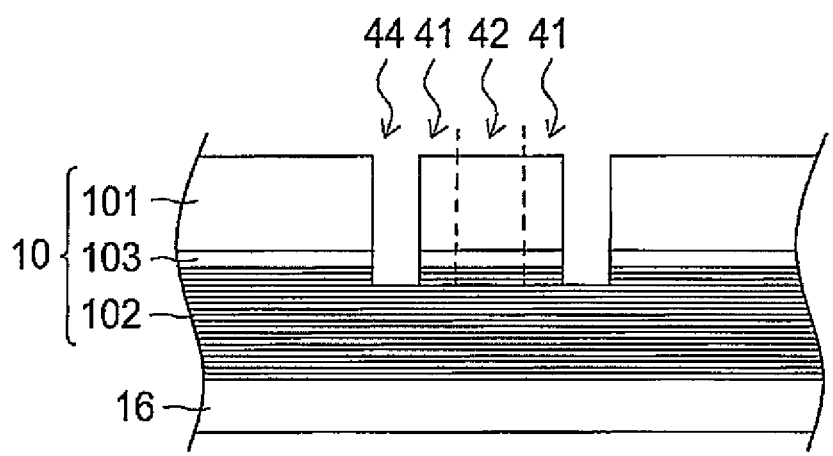
FIG. 7C illustrates a cross-sectional view taken along line Z-Z' of FIG. 7.

FIG. 7 to FIG. 9C illustrate a manufacturing method of the light-emitting array 4 of FIG. 6. FIG. 7 illustrates a top view of an epitaxial stack 10 being etched in accordance with second embodiment of the present application. FIG. 7A illustrates a cross-sectional view taken along line X-X' of FIG. 7. FIG. 7B illustrates a cross-sectional view taken along line Y-Y' of FIG. 7. FIG. 7C illustrates a cross-sectional view taken along line Z-Z' of FIG. 7. The epitaxial stack 10 of FIG. 7A comprises the same material and structure as that introduced in FIG. 2 and related description of the first embodiment. The epitaxial stack 10 is formed on a conductive substrate 16, such as GaAs substrate. Then, as shown in FIG. 7, the epitaxial stack 10 is patterned to form a plurality of light-emitting elements 41 and a plurality of bridge structures 42 by etching. The plurality of light-emitting elements 41 and the plurality of bridge structures 42 are separated from each other by a plurality of trenches 44. The plurality of trenches 44 is arranged in columns and rows, and the trenches 44 in adjacent two rows are alternately disposed. Each of the trenches 44 comprises circular shape as shown in FIG. 7, or polygonal shape (not shown). The trench 44 can be patterned by lithography and etching. Trench 44 extends downward through the epitaxial stack 10 to part of the bottom mirror stack 102. Each of the plurality of light-emitting elements 41 comprises a first semiconductor stack and each of the plurality of bridge structures 42 comprises a second semiconductor stack which has the same epitaxial stack as the first semiconductor stack.

As shown in FIG. 7B, each bridge structure 42 is formed between two adjacent trenches 44, wherein the two adjacent trenches 44 are in the same rows as shown in FIG. 7, or in different rows. Specifically, the bridge structures 42 and the trenches 44 are alternately arranged.

The light-emitting element 41 is formed between three neighbor trenches 44 as shown in FIG. 7. Two adjacent light-emitting elements 41 are separated by one bridge structure 42, and are jointly connected to the same bridge structure 42 as shown in FIG. 7C.

Figure 8:
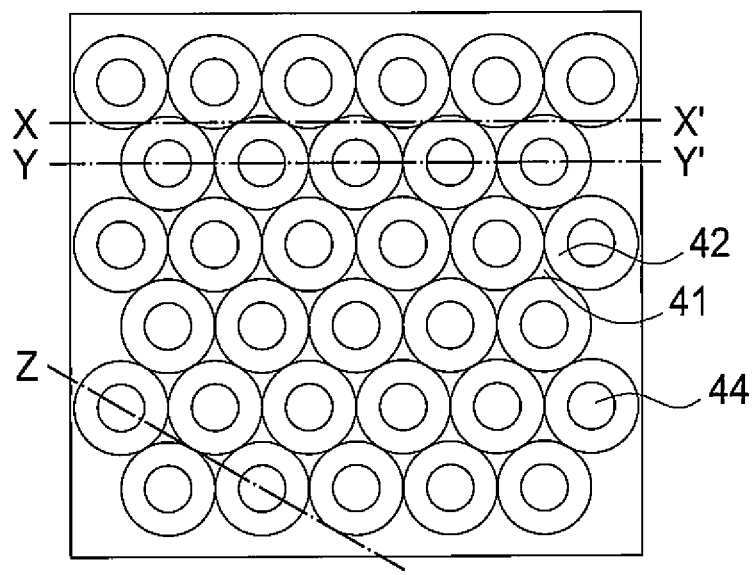
FIG. 8 illustrates a top view of the epitaxial stack of the light-emitting array being oxidized in accordance with second embodiment of the present application.
Figure 8A:
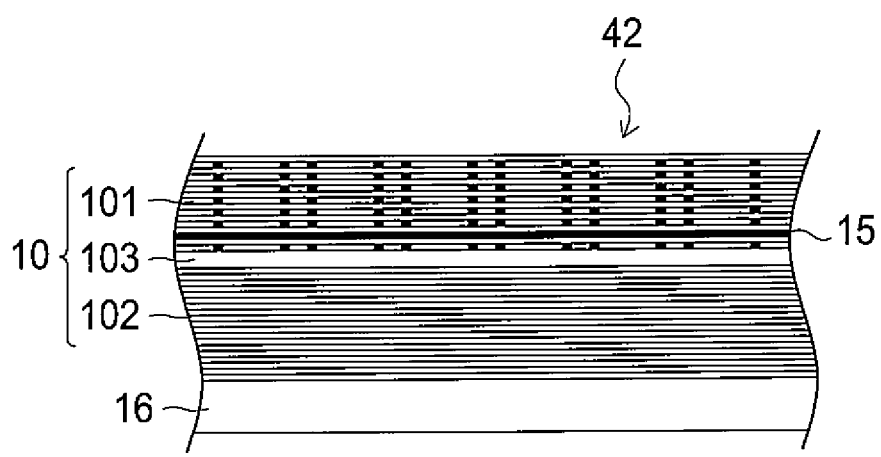
FIG. 8A illustrates a cross-sectional view taken along line X-X' of FIG. 8.

FIG. 8 illustrates a top view of the epitaxial stack 10 being oxidized in accordance with second embodiment of the present application. FIG. 8A illustrates a cross-sectional view taken along line X-X' of FIG. 8. Layers of the top mirror stack 101 with higher aluminum content is oxidized more easily than the layers of the top mirror stack 101 with lower aluminum content. The top mirror stack 101 can be oxidized laterally via the trenches 44 and the external edges of the layers with higher aluminum content. The portions of the layers with higher aluminum content of the top mirror stack 101 being oxidized are electrically insulated. In an example of the embodiment, the top mirror stack 101 comprises a confinement layer 15 in a bottom portion of the top mirror stack 101 as shown in FIG. 8A. In another example of the embodiment, the confinement layer 15 can be formed between the top mirror stack 101 and the active layer 103. The confinement layer 15 comprises III-V group semiconductor materials and comprises Al, such as $Al_{x5}Ga_{(1-x5)}As$, wherein $0.9 \leq x \leq 1.0$. The aluminum content x5 of the confinement layer 15 is higher than the aluminum content x1 or x2 of the layers in the top mirror stack 101 and/or the aluminum content x3 or x4 of the layers in the bottom mirror stack 102. For example, the confinement layer 15 can be $Al_{0.98}Ga_{0.02}As$.

Figure 8B:
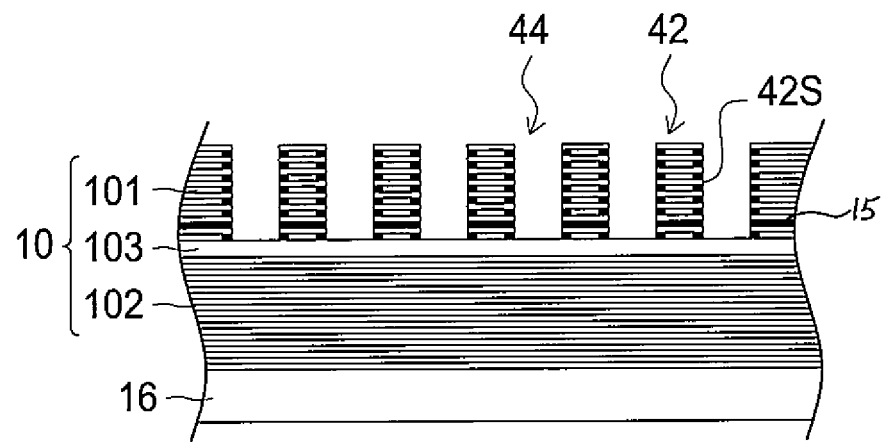
FIG. 8B illustrates a cross-sectional view taken along line Y-Y' of FIG. 8.

FIG. 8B illustrates a cross-sectional view taken along line Y-Y' of FIG. 8. The $Al_{x5}Ga_{(1-x5)}As$ based confinement layer 15 of the bridge structures 42 is oxidized, preferably totally oxidized, which provides isolation for the bridge structures 42. The plurality of bridge structures 42 is separated from each other by the plurality of trenches 44, and the oxidation is done by laterally oxidized from a side 42S of the bridge structure 42 or via the trench 44. Specifically, a steam containing oxygen flows into the trench 44 and laterally oxidized the sides of layers with aluminum content higher than 0.8 in the bridge structure 42 from the lateral side 42S of the bridge structure 12. Portions of the confinement layer 15 being oxidized in the plurality of bridge structures 42 are electrically insulated.

Figure 8C:
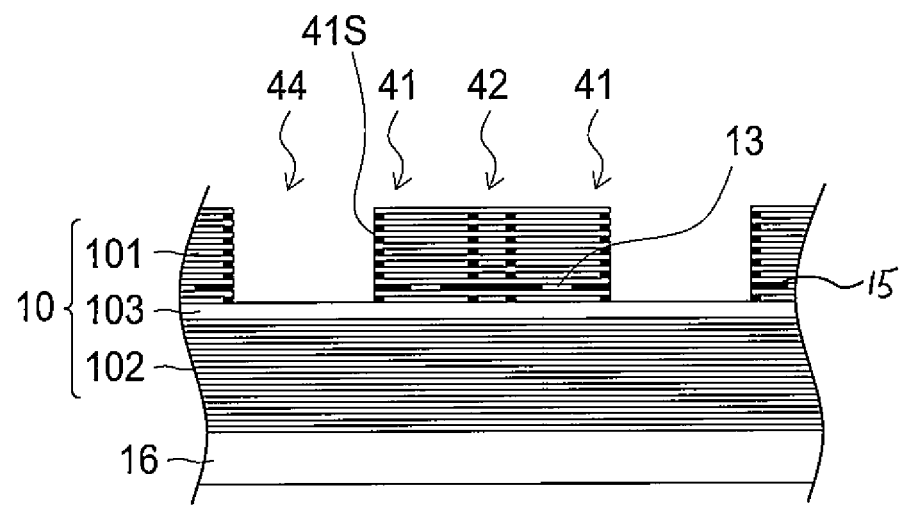
FIG. 8C illustrates a cross-sectional view taken along line Z-Z' of FIG. 8.

FIG. 8C illustrates a cross-sectional view taken along line Z-Z' of FIG. 8. The plurality of light-emitting elements 41 is separated from each other by the plurality of trenches 44 and the bridge structure 42. Part of the $Al_{x5}Ga_{(1-x5)}As$ based confinement layer 15 of the light-emitting element 41 is oxidized by laterally oxidized from a lateral side 41S of the light-emitting element 41. Specifically, a steam containing oxygen flows into the trench 44 and laterally oxidized the side of the confinement layer 15 and the sides of layers with aluminum content higher than 0.8 in the bridge structure 42 and the light-emitting element 41. As shown in FIG. 8C, a portion of the confinement layer 15 being oxidized is electrically insulated, and another portion of the confinement layer 15 not being oxidized forms a current confinement aperture 13. The current confinement aperture 13 is approximately formed in the center area of the confinement layer 15 in the light-emitting element 41.

Figure 9:
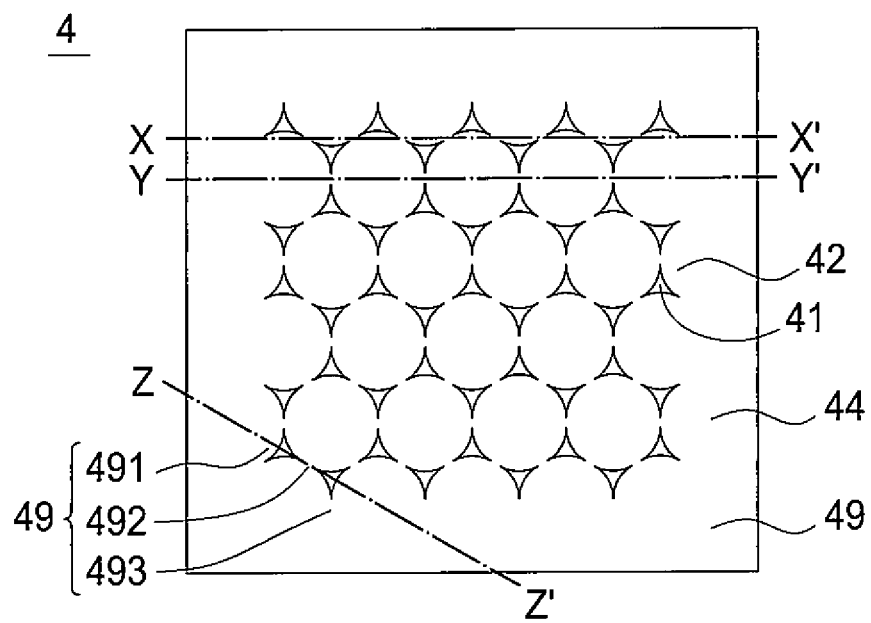
FIG. 9 illustrates a top view of the epitaxial stack of the light-emitting array having a first electrode formed thereon in accordance with second embodiment of the present application.
Figure 9A:
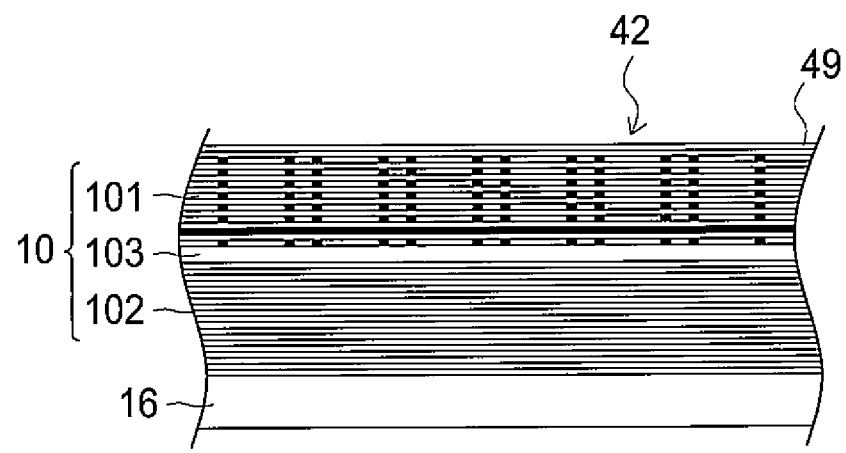
FIG. 9A illustrates a cross-sectional view taken along line X-X' of FIG. 9.

FIG. 9 illustrates a top view of an epitaxial stack of the light-emitting array having a first electrode 49 formed thereon in accordance with second embodiment of the present application. FIG. 9A illustrates a cross-sectional view taken along line X-X' of FIG. 9. The first electrode 49 comprises a plurality of contact portions 491 respectively formed on a partial surface of the light-emitting elements 41, preferably formed on the periphery surface of the light-emitting element 41, and a plurality of connecting portions 492 formed on the whole surfaces of the bridge structures 42. The first electrode 49 may further comprise a pad portion 493. The pad portion 493 can be provided for wire bonding. The material of the first electrode 49 comprises metal or metal alloy.

Figure 9B:
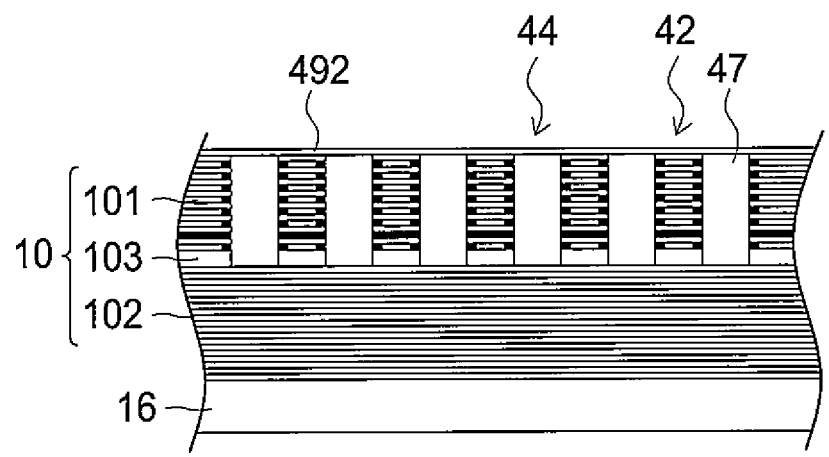
FIG. 9B illustrates a cross-sectional view taken along line Y-Y' of FIG. 9.

FIG. 9B illustrates a cross-sectional view taken along line Y-Y' of FIG. 9. An insulated layer 47 can be deposited in the trench 44 by sputter or chemical vapor deposition (CVD) or fills up the trench 44 with insulative materials. The insulative material of the insulated layer 47 comprises organic material, such as BCB or epoxy, or inorganic material, such as silicon nitride or silicon oxide. The connecting portion 492 is conformably formed on the bridge structure 42 and the insulated layer 47.

Figure 9C:
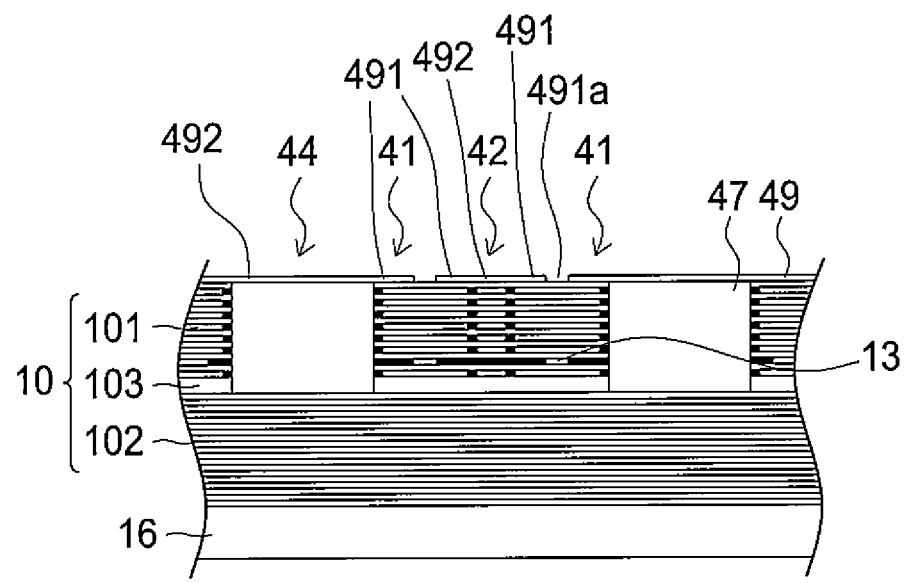
FIG. 9C illustrates a cross-sectional view taken along line Z-Z' of FIG. 9.

FIG. 9C illustrates a cross-sectional view taken along line Z-Z' of FIG. 9. The contact portion 491 has a ring-like shape of top view which forms an opening 491a on the light-emitting element 41, and the opening 491a is corresponding to the current confinement aperture 13. The opening 491a can be symmetrically formed on the top surface of the light-emitting element 41. The contact portion 491 and the connecting portion 492 form a contiguous layer. The connecting portion 492 is conformably formed on the bridge structure 42 and the insulated layer 47. The light of the light-emitting element 41 can be emitted through the opening 491a.

In an example of the embodiment, a second electrode (not shown) can be formed under the conductive substrate 16 of FIG. 9C. Current may be injected from the first electrode 49 and the second electrode (not shown). Following, the current spreads into each light-emitting element 41 through the connecting portion 492, and injects into each light-emitting element 41 through the contact portion 491. The current is restricted in an area of the top mirror stack 101 not oxidized and directed into the current confinement aperture 13 shown in FIG. 9C. Then, the current may pass through the active layer 103 and the bottom mirror stack 102 of each light-emitting element 41. A light is generated within a cavity constituted between the top mirror stack 101 and the bottom mirror stack 102. Finally, the light may be emitted to the outside through the opening 491a of the contact portion 491 on the light-emitting element 41 shown in FIG. 9C.

Figure 10:
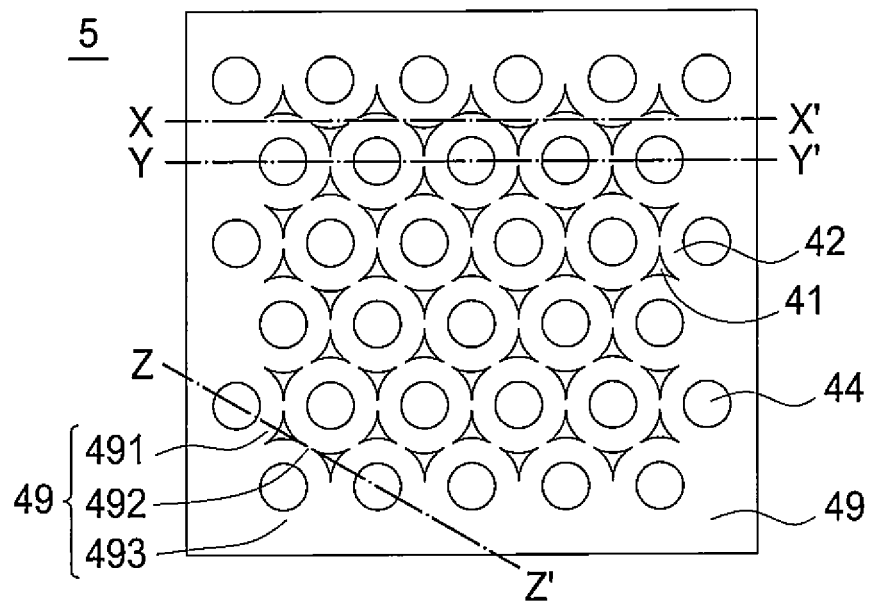
FIG. 10 illustrates a top view of a light-emitting array in accordance with third embodiment of the present application.

FIG. 10 illustrates a top view of a light-emitting array 5 in accordance with third embodiment of the present application. The light-emitting array 5, such as a vertical cavity surface emitting laser (VCSEL), comprises a plurality of light-emitting elements 41, a plurality of trenches 44, and a first electrode 49 provided in a contiguous layer and connected to each of the plurality of light-emitting elements 41, wherein partial areas of the light-emitting elements 41 not covered by the first electrode 49 are exposed. The first electrode 49 further comprises a pad portion (not shown).

A manufacturing method of the light-emitting array 5 is similar to that of the light-emitting array 4. The difference of the manufacturing method between the light-emitting array 4 and the light-emitting array 5 is the step of forming the electrode 49.

Figure 10A:
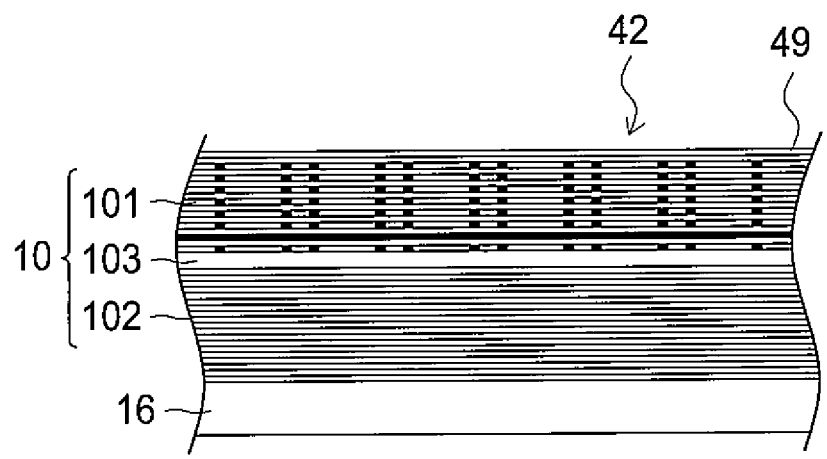
FIG. 10A illustrates a cross-sectional view taken along line X-X' of FIG. 10.

FIG. 10A illustrates a cross-sectional view taken along line X-X' of FIG. 10. The first electrode 49 comprising metal or metal alloy is formed on the bridge structure 42.

Figure 10B:
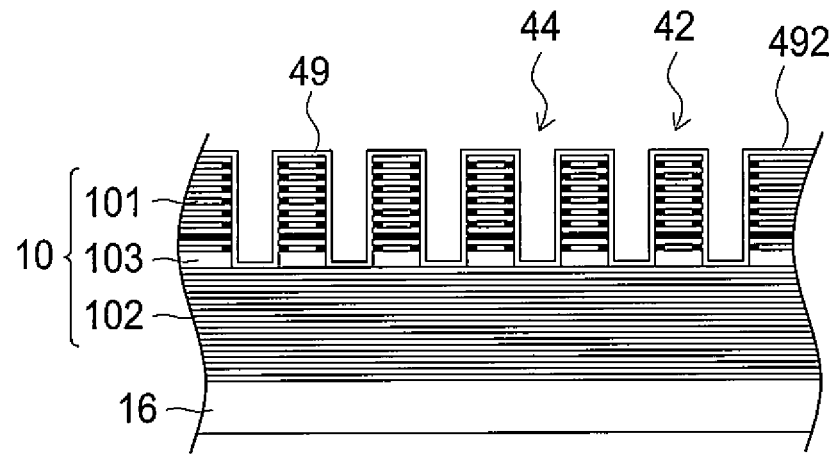
FIG. 10B illustrates a cross-sectional view taken along line Y-Y' of FIG. 10.

FIG. 10B illustrates a cross-sectional view taken along line Y-Y' of FIG. 10. The connecting portion 492 is conformably formed on the bridge structure 42 and the trench 44.

Figure 10C:
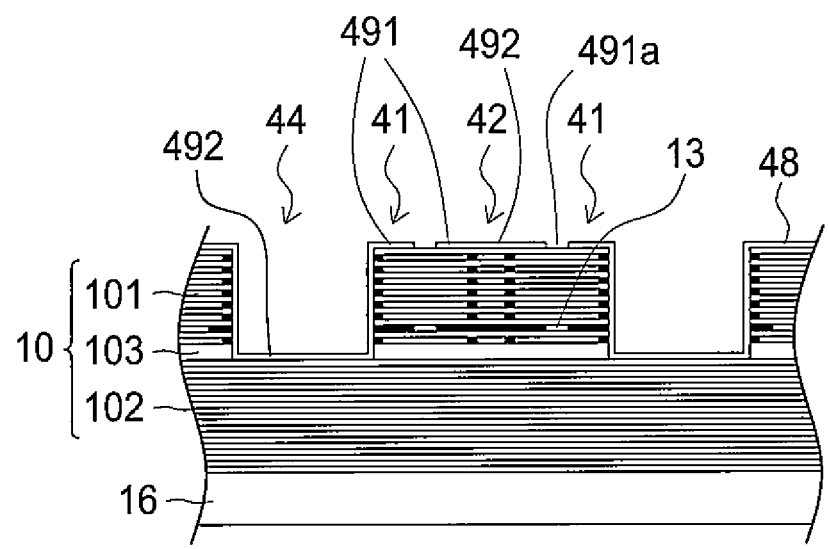
FIG. 10C illustrates a cross-sectional view taken along line Z-Z' of FIG. 10.

FIG. 10C illustrates a cross-sectional view taken along line Z-Z' of FIG. 10. The contact portion 491 comprises an opening 491a formed on the light-emitting element 41 and corresponding to the current confinement aperture 13. The connecting portion 492 is conformably formed on the bridge structure 42 and the trench 44. The light of the light-emitting element 11 can be emitted through the opening 491a.

In an example of the embodiment, a second electrode (not shown) can be formed under the conductive substrate 16 of FIG. 10A. Current may be injected from the first electrode 49 and the second electrode (not shown). Following, the current spreads into each light-emitting element 41 through the connecting portion 492, and injects into each light-emitting element 41 through the contact portion 491. The current is restricted in an area of the top mirror stack 101 not oxidized and directed into the current confinement aperture 13 shown in FIG. 10C. Then, the current may pass through the active layer 103 and the bottom mirror stack 102 of each light-emitting element 41. A light is generated within a cavity constituted between the top mirror stack 101 and the bottom mirror stack 102. Finally, the light may be emitted to the outside through the opening 491a of the contact portion 491 on the light-emitting element 41 shown in FIG. 10C.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting array, comprising:
   a plurality of light-emitting elements, wherein each of the plurality of light-emitting elements comprises a first semiconductor stack;
   a plurality of bridge structures connected to the plurality of light-emitting elements, wherein the plurality of light-emitting elements is spaced apart by the plurality of bridge structures, wherein each of the plurality of bridge structures comprises a second semiconductor stack which has the same epitaxial stack as the first semiconductor stack, the first semiconductor stack and the second semiconductor stack each comprises a top mirror stack having a first conductivity type, a bottom mirror stack having a second conductivity type, and an active layer formed between the top mirror stack and the bottom mirror stack; and
   a confinement layer with a aluminum composition higher than that of any other layer of the top mirror stack, wherein the confinement layer is formed in the first semiconductor stack and the second semiconductor stack;
   wherein the confinement layer in the second semiconductor stack is a continuous layer without forming any opening, and is continuously connected to the confinement layer in the first semiconductor stack.

2. The light-emitting array of claim 1, wherein the plurality of light-emitting elements and the plurality of bridge structures are alternately arranged.

3. The light-emitting array of claim 1, wherein the top mirror stack and/or the bottom mirror stack comprise group III-V semiconductor layer comprising Al.

4. The light-emitting array of claim 1, wherein the confinement layer in the first semiconductor stack comprises a current confinement aperture.

5. The light-emitting array of claim 4, further comprising an electrode formed on the top mirror stack and comprising an opening corresponding to the current confinement aperture.

6. The light-emitting array of claim 5, wherein the electrode is formed in a grid shape.

7. The light-emitting array of claim 5, wherein the electrode covers the whole surfaces of the plurality of bridge structures.

8. The light-emitting array of claim 5, further comprising a plurality of trenches, wherein the electrode is discontinuously formed in one of the plurality of trenches.

9. The light-emitting array of claim 8, wherein one of the plurality of light-emitting elements is formed between three neighbor trenches.

10. The light-emitting array of claim 8, wherein the trench is filled with an insulating material.

11. The light-emitting array of claim 8, further comprising an insulated layer conformably formed along the trench.

12. The light-emitting array of claim 8, wherein the electrode comprises a pad portion, wherein the plurality of bridge structures is connected to the pad portion.

13. The light-emitting array of claim 12, wherein the pad portion is disposed on a side of the plurality of light-emitting elements.

14. The light-emitting array of claim 12, wherein a surface area of the pad portion is larger than an area of one of the plurality of light-emitting elements.

15. A light-emitting array, comprising:
   a plurality of light-emitting elements, wherein each of the plurality of light-emitting elements comprises a first semiconductor stack;
   a plurality of bridges structures connected to the plurality of light-emitting elements, wherein the plurality of light-emitting elements is spaced apart by the plurality of bridge structures, wherein each of the plurality of bridge structure comprises a second semiconductor stack which has the same epitaxial stack as the first semiconductor stack;
   a confinement layer with an aluminum composition and is formed in the first semiconductor stack and the second semiconductor stack; and
   an electrode formed on the second semiconductor stack of the plurality of bridge structures;
   wherein the confinement layer in the second semiconductor stack is a continuous layer without forming any opening, and is continuously connected to the confinement layer in the first semiconductor stack.

16. The light-emitting array of claim 15, wherein the electrode approximately covers the whole surface of the plurality of bridge structures and does not cover the light-emitting elements.

17. The light-emitting array of claim 15, wherein the electrode is a contiguous layer.

18. The light-emitting array of claim 15, wherein the electrode comprises a plurality of contact portions and a plurality of connecting portions, the plurality of contact portions is formed on each of the plurality of light-emitting elements, and each of the plurality of connecting portions is formed between adjacent two contact portions.

19. The light-emitting array of claim 18, wherein the plurality of contact portions and the plurality of connecting portions forma contiguous layer.

20. The light-emitting array of claim 15, wherein the first semiconductor stack and the second semiconductor stack each comprises a top mirror stack having a first conductivity type, a bottom mirror stack having a second conductivity type, and an active layer formed between the top mirror stack and the bottom mirror stack, and the aluminum composition of the confinement layer is higher than that of any other layer of the top mirror stack.

* * * * *